(12) United States Patent
Ushida et al.

(10) Patent No.: US 7,379,326 B2
(45) Date of Patent: May 27, 2008

(54) LARGE-CAPACITY MAGNETIC MEMORY USING CARBON NANO-TUBE

(75) Inventors: Takashi Ushida, Furukawa (JP); Nobuyuki Mori, Furukawa (JP); Yoshimi Kamijo, Furukawa (JP); Akihiro Okazaki, Furukawa (JP); Akira Mitsuzuka, Furukawa (JP); Rikizou Hatakeyama, Furukawa (JP); Hideaki Ido, Furukawa (JP); Ko Nakajima, Furukawa (JP); Takehiro Takoshima, Furukawa (JP)

(73) Assignee: UMK Technologies Co., Ltd., Furukawa-shi (JP)

( * ) Notice: Subject to any disclaimer, the term of this patent is extended or adjusted under 35 U.S.C. 154(b) by 276 days.

(21) Appl. No.: 10/516,009

(22) PCT Filed: May 1, 2003

(86) PCT No.: PCT/JP03/05594

§ 371 (c)(1),
(2), (4) Date: Nov. 1, 2005

(87) PCT Pub. No.: WO04/001851

PCT Pub. Date: Dec. 31, 2003

(65) Prior Publication Data

US 2006/0092542 A1 May 4, 2006

(30) Foreign Application Priority Data

May 29, 2002 (JP) ............................. 2002-155384

(51) Int. Cl.
*G11C 11/00* (2006.01)
(52) U.S. Cl. ................ 365/158; 365/171; 365/173; 977/724; 977/865
(58) Field of Classification Search ................ 365/158, 365/171, 173; 977/724, 865
See application file for complete search history.

(56) References Cited

U.S. PATENT DOCUMENTS 5,748,399 A 5/1998 Gill 6,795,380 B2 * 9/2004 Akiyama et al. ........ 369/13.33
6,940,693 B2 * 9/2005 Lille et al. .................. 360/126

OTHER PUBLICATIONS

Patent Abstracts of Japan, Publication No. 2000-195002, dated on Jul. 14, 2000. Cited in the international search report.
Patent Abstracts of Japan, Publication No. 2001-162600, dated on Jun. 19, 2001. Cited in the international search report.

* cited by examiner

*Primary Examiner*—Pho M. Luu
(74) *Attorney, Agent, or Firm*—Westerman, Hattori, Daniels & Adrian, LLP.

(57) ABSTRACT

A high-capacity magnetic memory capable of writing and reading a magnetic record in/from a magnetic recording film according to a perpendicular magnetic recording system at a high speed in a purely-electrically random access manner. In the magnetic memory, a writing-magnetic-field generating means 62 and a writing word line 43 are disposed relative to a perpendicular magnetic recording film 50, and a reading/writing bit-line conductor 41, a magnetoresistive-effect element 20 and a reading word lead conductor 42 are laminated in order on a probe substrate opposed to the perpendicular magnetic recording film 50. A magnetic probe 30 composed of a carbon nanotube containing a soft magnetic material is disposed relative to the magnetoresistive-effect element 20 in a standing manner, and electrically connected to the reading/writing bit-line conductor. During a writing operation, a micro-discharge is generated in a micro-gap G between the edge of the magnetic probe and the magnetic recording film under a writing magnetic field to allow a writing current to flow through the micro-gap G so as to heat a micro-region of the magnetic recording film in such a manner that it goes through its Curie point to thereby become magnetized in the direction of the recording magnetic field to form a magnetic record therein. During a reading operation, the magnetic record is read out through the magnetic probe in accordance with a current variation in the magnetoresistive-effect element.

8 Claims, 7 Drawing Sheets

LARGE-CAPACITY MAGNETIC MEMORY USING CARBON NANO-TUBE

TECHNICAL FIELD

The present invention relates to a randomly accessible memory for use in an internal storage device of a computer, etc.

BACKGROUND ART

In connection with the enhancement of processing ability in computers, the development/spread of mobile devices, and the advent of broadband era where these devices are connected with each other via communication lines to exchange massive data therebetween, the amount of communication/processing data has been drastically increased. Collaterally, memory capacity in recent recording media for storing such massive data has been remarkably increased. At present, the memory capacity of a recording medium is increased up to several to over ten gigabits for MOs, DVDs or optical disks, and 16 to 256 gigabits for DRAMs.

The need for higher capacity in these recording media is becoming higher along with the popularization of image data processing and other factors, and various concept/practical developments are being made to break through limitations in not only removable type recording media, such as optical disks, but also randomly accessible memories, such as DRAMs, for an internal memory of a computer, so as to increase their storage capacity.

Magnetic recording media, which are writable/computer-readable and highly reliable, are widely used as embedded-type recording devices, such as computer hard disks. The magnetic recording media have a high storage capacity, which is currently increased up to several ten gigabits per square inch.

While there is the same strong need for higher storage capacity in magnetic recording media, the storage capacity of the magnetic recording medium based on a conventional recording system, or a longitudinal magnetic recording system designed to magnetize a magnetic film in a direction parallel to the film, is already close to its ultimate value, because the size of magnetic particles and the thickness of a magnetic film, which are inevitably reduced in connection with the increase in storage capacity, lead to decrease in anisotropic energy for magnetizing these magnetic particles and particle energy dependent on particle volume, and the resulting influence of thermal energy undesirably induces so-called thermal fluctuation phenomenon where magnetically recorded data, or magnetic record, will disappear over time.

A perpendicular magnetic recording system proposed by Emeritus Professor Shunichi Iwasaki, Tohoku University, Japan, in 1977, is intended to magnetize a magnetic recording film in a direction perpendicular to the film, and expected to be a technology allowing a drastic increase in storage capacity, because this system has a potential for bringing about effects of providing recording-magnetization enhanced by a diamagnetic field from adjacent bits while maintaining the thickness of the film to reduce the adverse affect of thermal fluctuation.

However, any magnetic-record writing mechanism suitable for this system has not been developed. This system also involves a certain restriction in access method due to the necessity of providing a drive mechanism for a recording medium as in the conventional recoding media, which causes difficulties in increasing a writing/reading speed.

Specifically, even though computer internal memories requiring a drive mechanism, such as a magnetic disk, MO or DVD, are randomly accessible, they are short on access speed due to mechanical motion going along with an access operation. Moreover, a mobile device involves difficulties in assuring a space for incorporating a drive mechanism for recording media, and thus cannot employ such recording media advanced in terms of higher storage capacity.

Thus, as challenges for the future, it is desired to achieve the writing/reading of a magnetic record to a magnetic film based on the perpendicular magnetic recording system so as to provide high-capacity recording media, and to eliminate the use of any mechanical drive mechanism so as to achieve purely-electrical random access with an extremely high writing/reading speed.

DISCLOSURE OF INVENTION

The present invention provides a magnetic recording method comprising disposing an electrode relative to a magnetic recording medium through a micro-gap, and generating a discharge between the electrode and the magnetic recording medium under a recording magnetic field to heat the magnetic recording medium in such a manner that it goes through a temperature of its Curie point or more and thereby becomes magnetized in the direction of the recording magnetic field.

In order to achieve a high-capacity magnetic memory having a high recording density based on the above method of the present invention, the electrode may have a probe-like configuration, and the magnetic recording medium may be a perpendicular magnetic recording film. Further, the electrode may include a carbon nanotube containing a soft magnetic material.

The present invention also provides a method of reading a magnetic record. This method comprises disposing a nano-magnetic probe electrode which includes a carbon nanotube containing a soft magnetic material and is superimposed relative to a magnetoresistive-effect element in a standing manner, adjacently to a magnetic recording medium, and reading a magnetic record in the magnetic recording medium through the magnetic probe electrode.

In order to achieve a high-density high-capacity magnetic memory based on this method of the present invention, the magnetic recording medium may be a perpendicular magnetic recording film.

Furthermore, the present invention provides a magnetic memory randomly accessible in a purely-electrical manner. This magnetic memory comprises means for generating a writing magnetization and a writing word line which are disposed relative to one of the opposite surfaces of a perpendicular magnetic recording film, a magnetoresistive-effect element provided with a reading/writing bit-line conductor and a reading word line, and a nano-magnetic probe electrode which includes a carbon nanotube containing a soft magnetic material and is disposed relative to the magnetoresistive-effect element in a standing manner. The nano-magnetic probe electrode is electrically connected to the reading/writing bit-line conductor, and disposed in opposed relation to the surface of the magnetic recording film through a micro-gap.

BRIEF DESCRIPTION OF DRAWINGS

FIGS. 2(a) and 2(b) are explanatory diagrams of a writing mode in the magnetic memory of the present invention, wherein

FIGS. 3(a) and 3(b) are explanatory diagrams of a reading mode in the magnetic memory of the present invention, wherein

FIGS. 4(a) and 4(b) show a high-capacity memory of the present invention, wherein

BEST MODE FOR CARRYING OUT THE INVENTION

Figure 1:
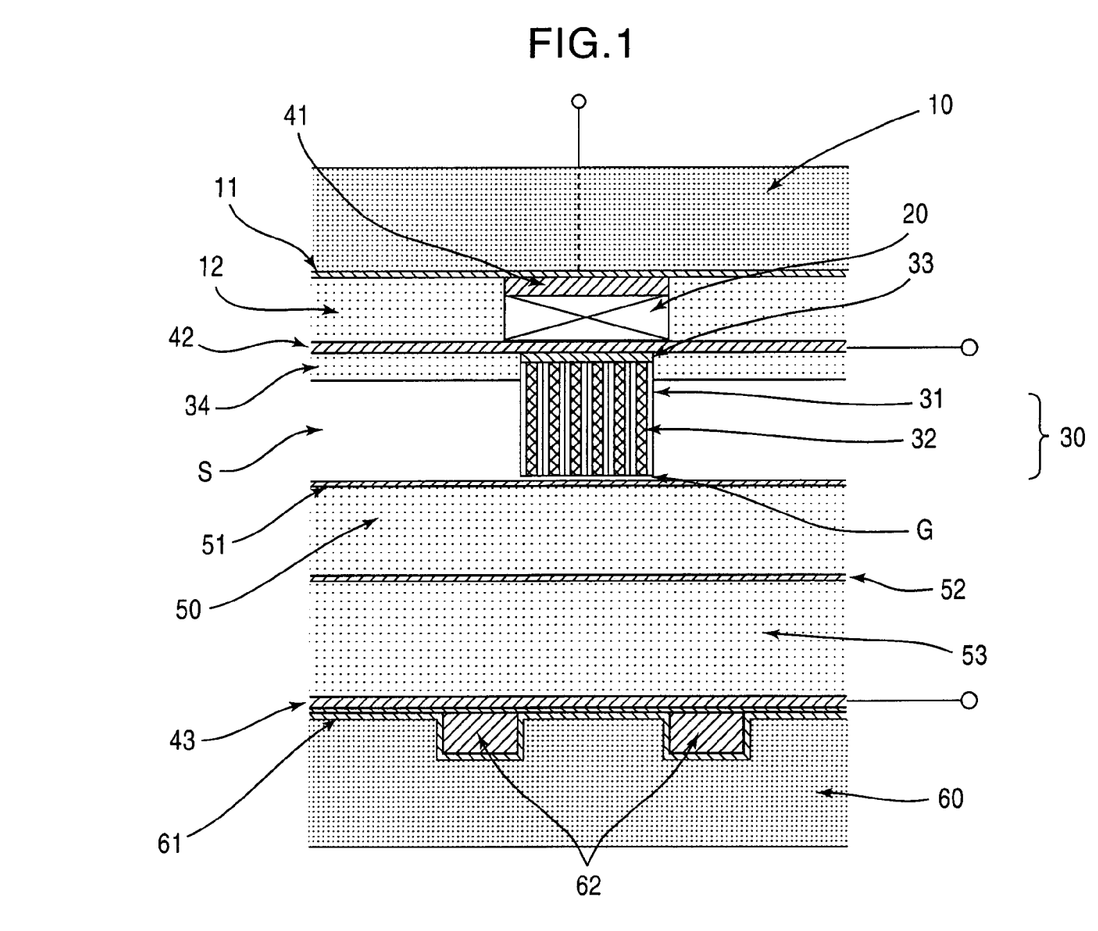
FIG. 1 is a sectional view showing the basic structure of one of the units of a magnetic memory of the present invention.

FIG. 1 is a sectional view of the basic structure of one of the units of a magnetic memory of the present invention.

The magnetic memory has an overall structure in which the plurality of units are arranged continuously and 2- or 3-dimentionally in a matrix form to construct a high-capacity magnetic memory.

Each of the units comprises a probe section disposed on the upper side of the unit, and a magnetic recording medium section disposed on the lower side of the unit.

The probe section includes a nano-magnetic probe 30, a fixing conductive film 33 (e.g. indium film) for fixing the nano-magnetic probe 30 in a electrically conductive manner to a reading word line conductor 42 serving as a reading word line, a magnetoresistive-effect element 20 (e.g. magnetoresistive (MR) effect element, giant magnetoresistive (GMR) effect element and tunneling magnetoresistive (TMR) effect element) formed on the reading word line conductor, and a reading/writing bit-line conductor 41 formed on the magnetoresistive-effect element to serve as a reading and writing bit-line.

These components of the probe section are laminated in order on the lower surface of a probe substrate 10 through an insulating film 11.

The nano-magnetic probe 30 includes a single carbon nanotube 31 containing a soft magnetic material 32 (e.g. Fe or Ni) or an array of the carbon nanotubes 31.

The magnetic recording medium section includes a perpendicular magnetization film 50 (e.g. Co—Cr—Ta film) having an upper surface covered by an insulating film 51 (e.g. SiO$_2$ film), a soft magnetic film 53 (e.g. Fe—Ni film) formed on the lower surface of the perpendicular magnetization film 50 through a nonmagnetic conductive film 52 for magnetically insulating the soft magnetic film 53 while maintaining electrical conductivity with the perpendicular magnetization film 50, a writing word line conductor 43 serving as a writing word line, and a writing-magnetization generating coil conductor 62 for generating a data-writing magnetic field, which is disposed relative to the lower surface of the writing word line conductor 43 through an insulating film 61 (e.g. SiO$_2$ film). As with the probe section, these components of the magnetic recording medium section are laminated in order on the upper surface of a magnetic recording medium substrate 60.

The nano-magnetic probe 30 is disposed in opposed relation to the perpendicular magnetization film 50 through a micro-gap G, and the space S therebetween is sealed in a vacuum or depressurized state. If the conditions for generating a micro-discharge are satisfied, the space may be maintained under an inert atmosphere instead of the depressurized state.

The detailed description about a process of forming the above structure will be omitted. Basically, while the above structure may be formed through dry or wet lithography as a micro-patterning technique, the dry lithography is preferable in view of micronization for achieving the intended high capacity in the present invention and burdens on the environment.

The nano-magnetic probe may be prepared through any suitable conventional process, such as a process of opening the edge of a nanotube to introduce a molten metal therein (see, for example, Japanese Patent Laid-Open Publication No. 06-227806) or a process of adding metal halide to allow a Fe-based or Ni-based alloy to be contained in a carbon nanotube in concurrence with the formation of the carbon nanotube (see, for example, Japanese Patent Laid-Open Publication No. 2001-89116).

Further, a photolithographic technique may be used to locate an array of soft magnetic material-containing carbon nanotubes at a given position of a word line on a probe substrate. Specifically, the reading word line conductor 42 is first patterned through photolithography. Then, the conductive layer 33 and the insulating film 34 are formed on the lower surface of the conductor 42, and a fixing hole for positioning the soft magnetic material-containing carbon nanotubes is formed in the insulating film 34 through photolithography.

The soft magnetic material-containing carbon nanotubes may be positioned in the fixing hole through a process in which magnetic carbon nanotubes dispersed in a liquid medium added with a matrix material are arrayed on a substrate under a magnetic field through the use of the magnetic property of the magnetic carbon nanotubes, and the edges of the magnetic carbon nanotubes fixed by the hardened matrix material are exposed by removing the matrix material through etching (see, for example, Japanese Patent Laid-Open Publication No. 2001-167692). In this process, the matrix material may be removed through any other suitable technique.

Figure 2A:
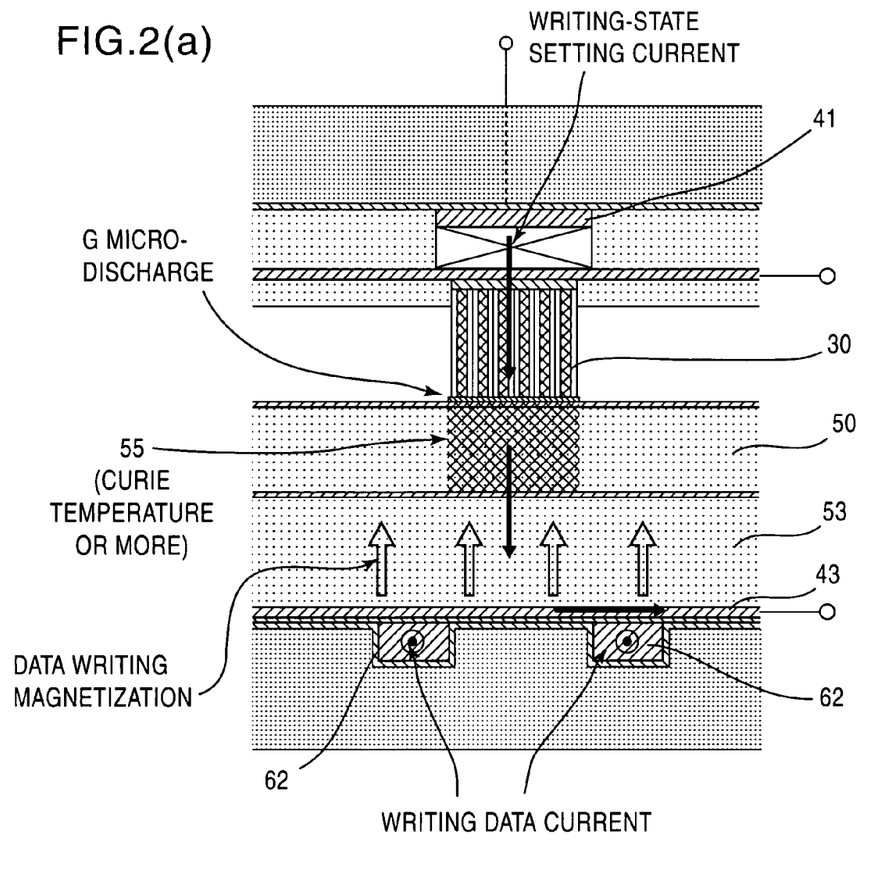
FIG. 2(a) shows the magnetic memory in the course of the writing mode.
Figure 2B:
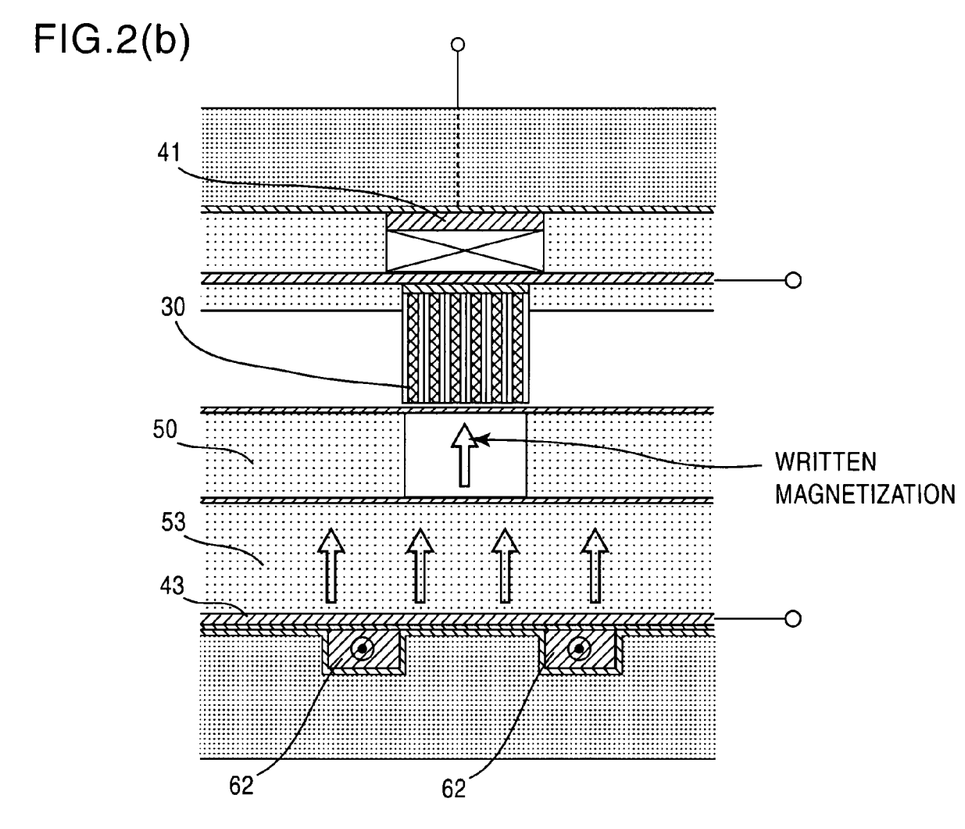
FIG. 2(b) shows the magnetic memory after completion of the writing mode.

With reference to FIGS. 2(a) and 2(b), a writing operation will be described.

A certain voltage is applied between a selected one of the bit-lines 41 and the writing word line 43, and simultaneously a writing data current is supplied to the writing-magnetization generating coil conductor 62 (FIG. 2(a)).

This readily induces dielectric breakdown in the insulating film 51 having an extremely small thickness to generate a micro-discharge in the micro-gap G so as to allow a cell writing current to flow through the insulating film 51. Further, in conjunction with the micro-discharge, a micro-region 55 of the perpendicular magnetization film 50 opposed to the nano-magnetic probe 30 is instantaneously heated to have a temperature greater than its Curie point, and thereby the magnetization of the region disappears.

At the same time, the soft magnetic film 53 is magnetized in a direction corresponding to that of the writing data current in the writing-magnetization generating coil conductor 62.

In this state, when the above cell writing current is cut off, only the micro-region 55 of the perpendicular magnetization film 50 heated to have a temperature greater than its Curie point is magnetized in the magnetization direction of the soft magnetic film 53, and the remaining region of the perpendicular magnetization film 50 has a magnetization direction maintained in a previous state without any influence of the magnetization direction of the soft magnetic film 53 (FIG. 2(b)).

In this stage, the writing data current is cut off to complete a series of writing cycles.

The robustness of a carbon nanotube as one of features thereof, and the surrounding space S sealed in a vacuum or depressurized state to have a significantly reduced oxygen concentration can prevent damages in the nano-magnetic probe even under the above micro-discharge.

Figure 3A:
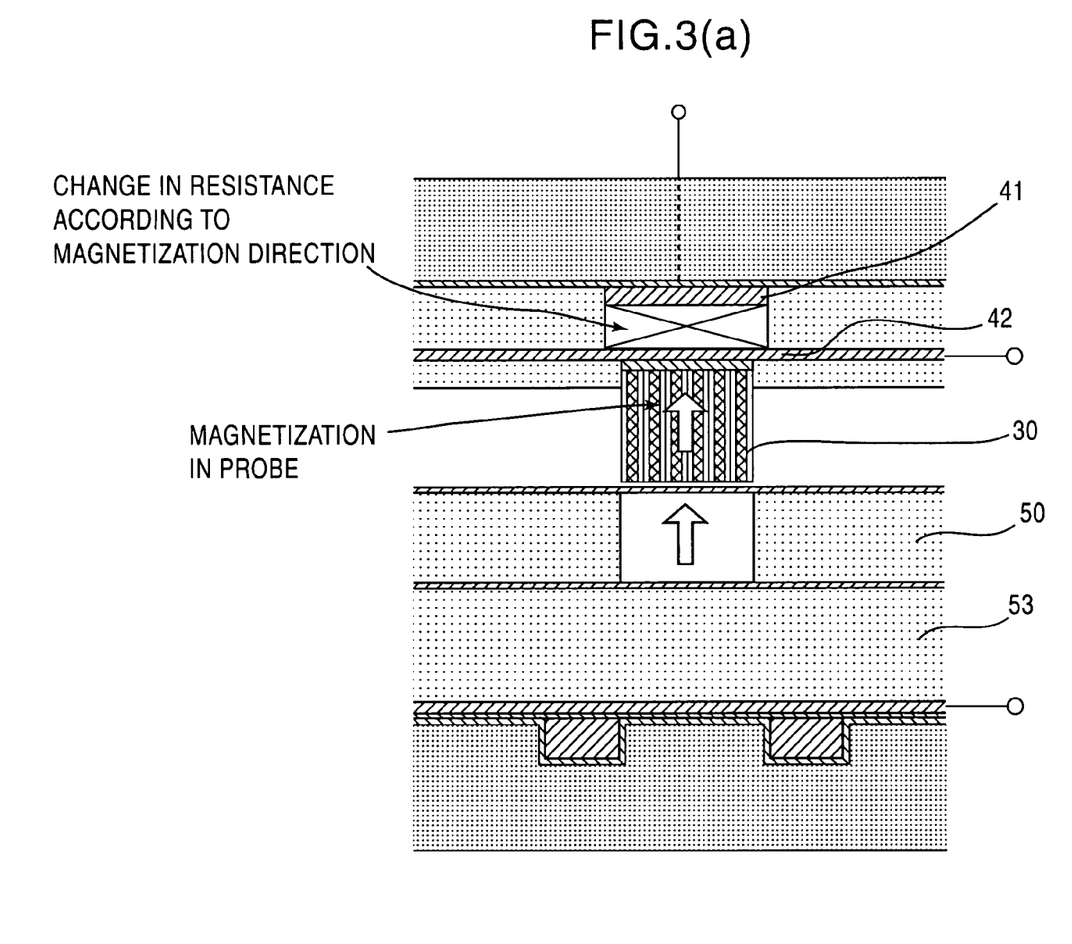
FIG. 3(a) shows the magnetic memory in a magnetically recorded state.
Figure 3B:
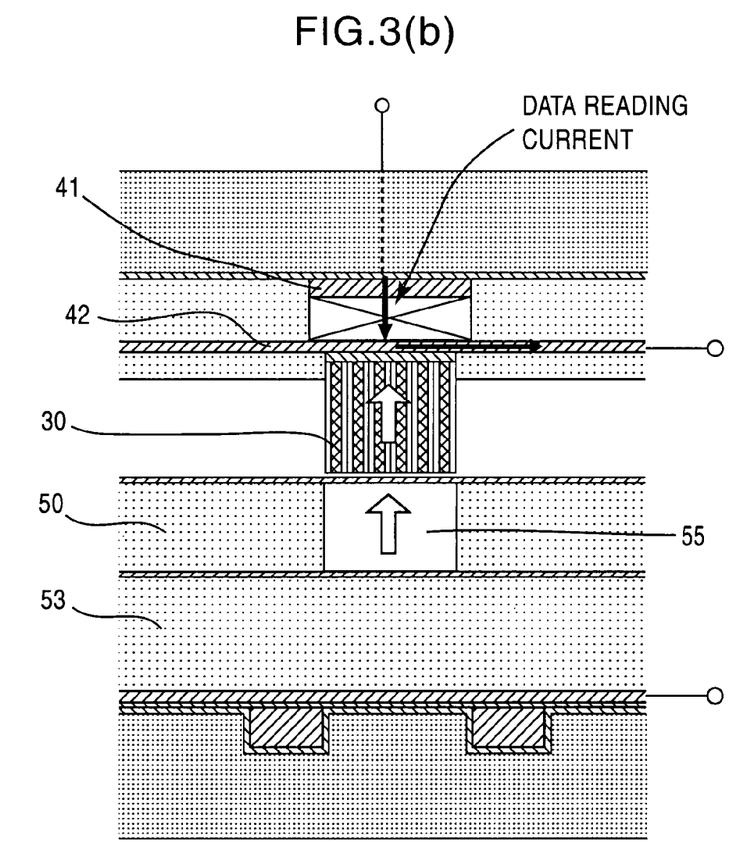
FIG. 3(b) shows the magnetic memory in the course of the reading mode.

With reference to FIGS. 3(a) and 3(b), a reading operation will be described below.

Through the writing cycles, the micro-region 55 of the perpendicular magnetization film 50 opposed to the nano-magnetic probe 30 is magnetized in a direction corresponding to written data (FIG. 3(a)).

Further, the soft magnetic material in the nano-magnetic probe is magnetized in the same direction of that of the perpendicular magnetization film, and thus the magnetoresistive-effect element has a resistance changed in proportion to the written data.

In this state, when a reading current is supplied between a selected one of the bit-lines and the reading word line 42, the reading current is changed in proportion to the resistance of the magnetoresistive-effect element, and thus the written data can be read out (FIG. 3(b)).

The above operations have been described in connection with a writable/computer-readable memory or re-writable recording medium. However, as evidenced by the above structure, the magnetic memory of the present invention may be used as a ROM. Further, the above writing and reading techniques may also be applied to other types of magnetic recording media in principle.

Figure 4A:
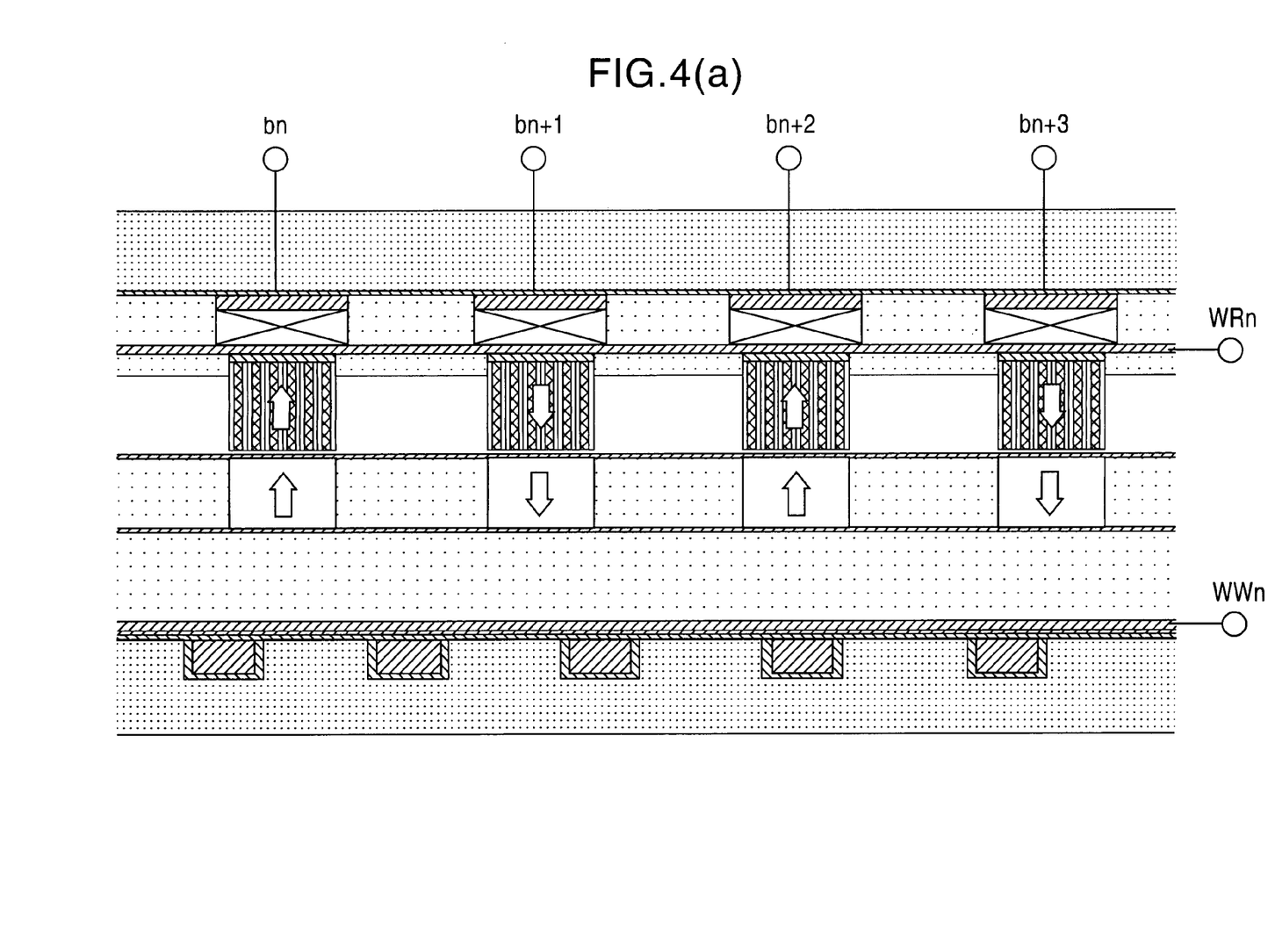
FIG. 4(a) is a sectional view of the memory.
Figure 4B:
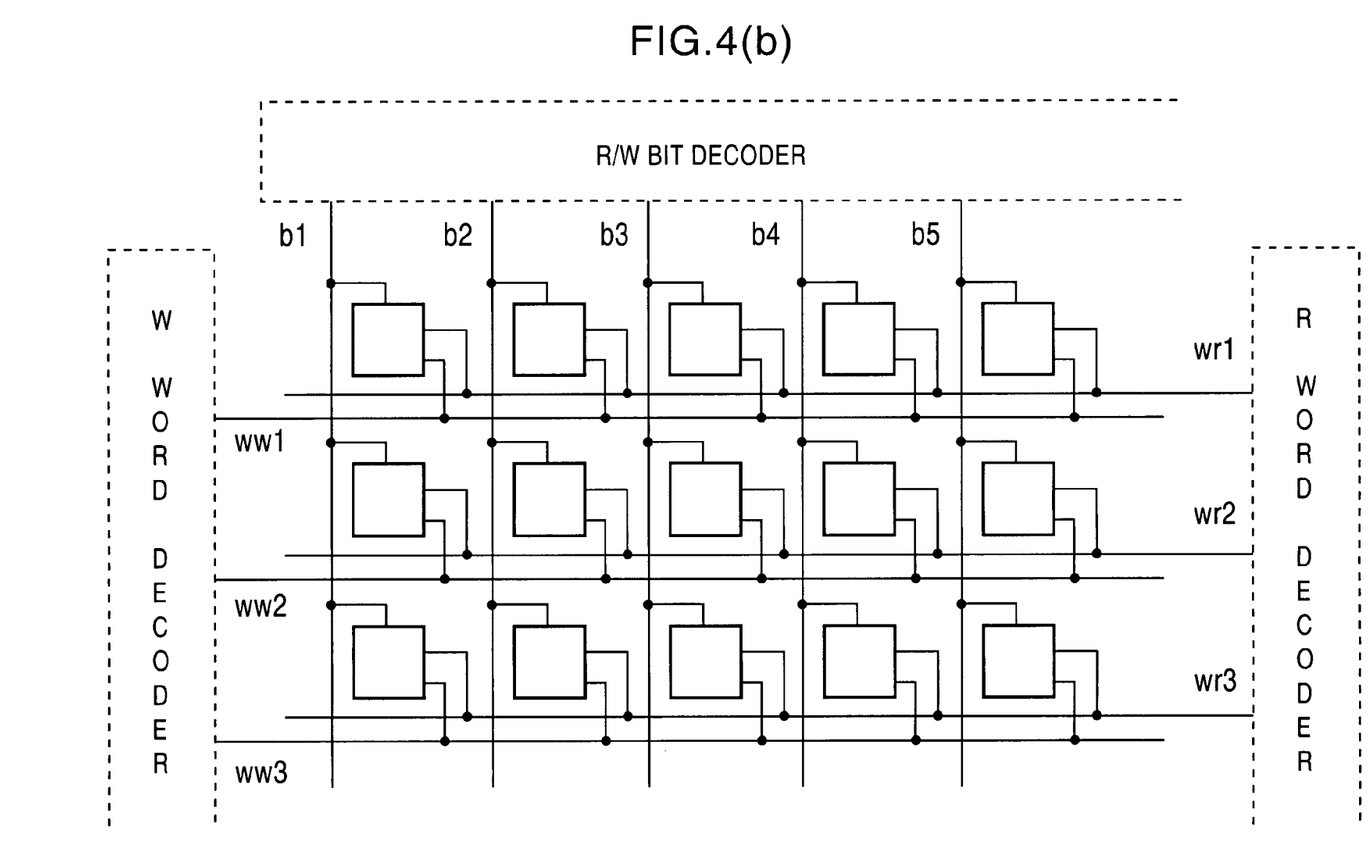
FIG. 4(b) is a circuit diagram of the memory.

The sectional structure and the circuit configuration of a high-capacity magnetic memory of the present invention are shown in FIGS. 4(a) and 4(b), respectively.

INDUSTRIAL APPLICABILITY

The high-capacity magnetic memory of the present invention utilizes the characteristics of a carbon nanotube to allow nano-scale magnetic recording and reading of the magnetic record so as to achieve a high-capacity recording beyond the limit of the conventional magnetic recording system and comply with the demand of the future information-oriented society.

In addition, the high-capacity magnetic memory randomly accessible in a purely-electrical manner can be used as an internal memory for computers to allow massive data to be read out at an extremely high speed while eliminating the use of any hard disk. This solves a problem concerning a time loss in reading from a conventional hard disk or external storage device so as to allow a computer to practically have a significantly enhanced response speed.

The structural feature of having no mechanical drive mechanism allows the high-capacity magnetic memory to be used as not only embedded-type memories but also removable memories for mobile devices or the like, and can have a wide range of applications based on a synergistic effect with the functional feature of being randomly accessible in a purely-electrical manner.

Therefore, the high-capacity magnetic memory of the present invention has a significant contribution to industrial development in the future information-oriented society.

What is claimed is:

1. A magnetic recording method comprising:
    disposing an electrode relative to a magnetic recording medium through a micro-gap; and
    generating a discharge between said electrode and said magnetic recording medium under a recording magnetic field to heat said magnetic recording medium in such a manner that it goes through a temperature of its Curie point or more and thereby becomes magnetized in the direction of said recording magnetic field.

2. The magnetic recording method as defined in claim 1, wherein said electrode has a probe-like configuration.

3. The magnetic recording method as defined in claim 1 or 2, wherein said magnetic recording medium is a perpendicular magnetic recording film.

4. The magnetic recording method as defined in claim 1 or 2, wherein said electrode includes a carbon nanotube containing a soft magnetic material.

5. A method of reading a magnetic record, comprising:
    disposing a nano-magnetic probe electrode which includes a carbon nanotube containing a soft magnetic material, adjacently to a magnetic recording medium, said nano-magnetic probe being superimposed relative to a magnetoresistive-effect element in a standing manner; and
    reading a magnetic record in said magnetic recording medium through said magnetic probe electrode.

6. The method as defined in claim 5, wherein said magnetic recording medium is a perpendicular magnetic recording film.

7. A method of writing/reading a magnetic record, comprising:
    disposing a nano-magnetic probe electrode which includes a carbon nanotube containing a soft magnetic material, relative to a magnetic recording medium through a micro-gap, and generating a discharge between said electrode and said magnetic recording medium under a recording magnetic field to heat said magnetic recording medium in such a manner that it goes through a temperature of its Curie point or more to thereby become magnetized in the direction of said recording magnetic field so as to form a magnetic record therein; and
    superimposing said nano-magnetic probe electrode relative to a magnetoresistive effect element in a standing manner, and reading said magnetic record through said magnetic probe electrode.

8. A magnetic memory randomly accessible in a purely-electrical manner, comprising:
    means for generating a writing magnetization and a writing word line which are disposed relative to one of the opposite surfaces of a perpendicular magnetic recording film;
    a magnetoresistive-effect element provided with a reading/writing bit-line conductor and a reading word line; and
    a nano-magnetic probe electrode including a carbon nanotube containing a soft magnetic material, said nano-magnetic probe being disposed relative to said magnetoresistive-effect element in a standing manner,
    wherein said nano-magnetic probe electrode is electrically connected to said reading/writing bit-line conductor, and disposed in opposed relation to said surface of said magnetic recording film through a micro-gap.

* * * * *